United States Patent
Hong et al.

(10) Patent No.: US 9,450,071 B2
(45) Date of Patent: Sep. 20, 2016

(54) FIELD EFFECT SEMICONDUCTOR DEVICES AND METHODS OF MANUFACTURING FIELD EFFECT SEMICONDUCTOR DEVICES

(75) Inventors: Ki-ha Hong, Cheonan-si (KR);
Jong-seob Kim, Hwaseong-si (KR);
Jae-joon Oh, Seongnam-si (KR);
Jai-kwang Shin, Anyang-si (KR);
Hyuk-soon Choi, Hwaseong-si (KR);
In-jun Hwang, Hwaseong-si (KR);
Ho-jung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 444 days.

(21) Appl. No.: 12/923,266

(22) Filed: Sep. 13, 2010

(65) Prior Publication Data
US 2011/0062448 A1 Mar. 17, 2011

(30) Foreign Application Priority Data
Sep. 11, 2009 (KR) .................. 10-2009-0085874

(51) Int. Cl.
*H01L 29/66* (2006.01)
*H01L 29/423* (2006.01)
*H01L 29/778* (2006.01)
*H01L 29/20* (2006.01)

(52) U.S. Cl.
CPC ... *H01L 29/66462* (2013.01); *H01L 29/42316* (2013.01); *H01L 29/7787* (2013.01); *H01L 29/2003* (2013.01)

(58) Field of Classification Search
CPC .............. H01L 29/7787; H01L 29/66462; H01L 29/42316; H01L 29/4232; H01L 29/2003; H01L 21/82345; H01L 2924/13085

USPC .................. 257/76, 192, 250, 331, E21.623, 257/E21.637
See application file for complete search history.

(56) References Cited

U.S. PATENT DOCUMENTS

| 4,636,824 A * | 1/1987 | Ikoma ..................... H01L 29/78 257/365 |
| 4,806,998 A * | 2/1989 | Vinter et al. .................. 257/192 |
| 7,268,375 B2 | 9/2007 | Shur et al. |
| 7,382,001 B2 * | 6/2008 | Beach ........................... 257/194 |

(Continued)

FOREIGN PATENT DOCUMENTS

| JP | 07-193223 A | 7/1995 |
| JP | 2004-327891 A | 11/2004 |

(Continued)

OTHER PUBLICATIONS

Santhakumar et al., "Monolithic Millimeter-wave Distributed Amplifiers using AlGaN/GaN HEMTs", IEEE (2008) pp. 1063-1066.*

(Continued)

*Primary Examiner* — Jay C Kim
(74) *Attorney, Agent, or Firm* — Harness, Dickey & Pierce, P.L.C.

(57) ABSTRACT

Field effect semiconductor devices and methods of manufacturing the same are provided, the field effect semiconductor devices include a second semiconductor layer on a first surface of a first semiconductor layer, a first and a second third semiconductor layer respectively on two sides of the second semiconductor layer, a source and a drain respectively on the first and second third semiconductor layer, and a gate electrode on a second surface of the first semiconductor layer.

14 Claims, 5 Drawing Sheets

(56) References Cited

U.S. PATENT DOCUMENTS

| | | | |
|---|---|---|---|
| 7,629,632 B2* | 12/2009 | Twynam | 257/260 |
| 7,863,877 B2* | 1/2011 | Briere | 323/282 |
| 7,952,117 B2* | 5/2011 | Masuda | H01L 29/41758 257/192 |
| 8,114,717 B2* | 2/2012 | Palacios et al. | 438/142 |
| 8,188,459 B2* | 5/2012 | Palacios et al. | 257/20 |
| 2003/0102482 A1* | 6/2003 | Saxler | 257/85 |
| 2005/0082568 A1* | 4/2005 | Hirose et al. | 257/192 |
| 2005/0087752 A1 | 4/2005 | Shur et al. | |
| 2005/0253168 A1* | 11/2005 | Wu et al. | 257/192 |
| 2008/0123232 A1* | 5/2008 | Harris | H02H 9/025 361/56 |
| 2009/0108299 A1 | 4/2009 | Smorchkova et al. | |
| 2009/0146233 A1 | 6/2009 | Hall et al. | |
| 2010/0065923 A1* | 3/2010 | Charles et al. | 257/402 |

FOREIGN PATENT DOCUMENTS

| | | |
|---|---|---|
| JP | 2006-173582 A | 6/2006 |
| JP | 2006-253559 A | 9/2006 |
| JP | 2009-054807 A | 3/2009 |
| KR | 10-2007-0081740 | 8/2007 |
| KR | 10-0770132 B1 | 10/2007 |
| WO | WO 2008/128160 * 10/2008 ........... H01L 29/778 |
| WO | WO-2009/076076 | 6/2009 |

OTHER PUBLICATIONS

Office Action from Korean Patent Application No. 10-2009-0085874, dated Sep. 1, 2015.

Korean Office Action dated Feb. 2, 2016 issued in Korean Application No. 10-2009-0085874 (with English translation).

* cited by examiner

FIELD EFFECT SEMICONDUCTOR DEVICES AND METHODS OF MANUFACTURING FIELD EFFECT SEMICONDUCTOR DEVICES

CROSS-REFERENCE TO RELATED APPLICATIONS

This application claims the benefit of priority under 35 U.S.C. §119 from Korean Patent Application No. 10-2009-0085874, filed on Sep. 11, 2009, in the Korean Intellectual Property Office, the disclosure of which is incorporated herein in its entirety by reference.

BACKGROUND

1. Field

Example embodiments relate to field effect semiconductor devices including a gallium nitride (GaN)-based semiconductor having a gate electrode formed on a surface opposite to a surface for forming a source and a drain, and methods of manufacturing the same.

2. Description of the Related Art

Due to the ongoing development of communication technologies, research is being conducted on communication devices for use in high frequency bands. In particular, field effect semiconductor devices (e.g., high electron mobility transistors (HEMTs)) are receiving considerable attention as communication devices for use in high frequency bands.

A HEMT is a heterogeneous junction field effect transistor including a structure formed by combining materials having different band gaps. Because a heterogeneous junction structure is formed of materials having different band gaps, the electron mobility may be increased by creating a two-dimensional electron gas (2D-EG) region in a junction interface.

Normally, because silicon (Si) used to form a semiconductor device has low electron mobility, a substantially high source resistance may be generated. Thus, research is being conducted on various ways to use Groups III through V semiconductor compounds to form high electron mobility transistors. In particular, a gallium nitride (GaN)-based compound has a relatively wide band gap and high electron saturation velocity, and is chemically stable. As such, gallium nitride-based compounds are receiving considerable attention as a material for forming high electron mobility transistors. Active research is being conducted on high electron mobility transistors formed of GaN-based compounds as high-temperature, high-output and high-frequency electronic devices.

Generally, a high electron mobility transistor has normally-on characteristics. As such, excessive currents may flow when power is supplied to devices including high electron mobility transistors, and a negative power supply is required to change the high electron mobility transistor to an off-state. One of the GaN-based compound layers may be formed substantially thin in order to obtain normally-off characteristics of the transistor, thereby preventing normally-on characteristics. However, an electric field may be weakened due to piezo-polarization, and the concentration of electrons of a 2D-EG region formed in the heterogeneous junction may be reduced.

SUMMARY

Example embodiments relate to field effect semiconductor devices including a gallium nitride (GaN)-based semiconductor having a gate electrode formed on a surface opposite to a surface for forming a source and a drain, and methods of manufacturing the same.

Additional aspects will be set forth in part in the description which follows and, in part, will be apparent from the description, or may be learned by practice of the presented embodiments.

According to example embodiments, a field effect semiconductor device includes a second semiconductor layer formed on a first surface of a first semiconductor layer, third semiconductor layers respectively formed on two sides of the second semiconductor layer, a source and a drain formed respectively on the third semiconductor layers, and a gate electrode formed on a second surface of the first semiconductor layer.

The gate electrode may have a double gate structure. The gate electrode may include a first gate formed on a portion of the second surface of the first semiconductor layer, an insulating layer formed to cover the first gate electrode, and a second gate electrode formed on the insulating layer and the second surface of the first semiconductor layer.

A distance between the first gate electrode and the drain may be greater than a distance between the first gate electrode and the source. A distance between the gate electrode and the drain may be from several hundreds of nm to several μm.

The first semiconductor layer and the third semiconductor layers may be formed of a material having a greater band gap energy than a material used to form the second semiconductor layer. The first semiconductor layer, the second semiconductor layer and the third semiconductor layers may be formed of a gallium nitride (GaN)-based semiconductor material. The first semiconductor layer and the third semiconductor layers may be formed of $Al_xGa_{1-x}N$ (wherein $0<x<1$).

The second semiconductor layer may be formed of GaN.

The first semiconductor layer, the second semiconductor layer and the third semiconductor layers may be formed of Groups III through IV semiconductor compounds.

According to example embodiments, a method of manufacturing a field effect semiconductor device includes forming a buffer layer, a first semiconductor layer, a second semiconductor layer and a third semiconductor layer on a substrate. A source and a drain are formed by coating a conductive material on the third semiconductor layer and etching the conductive material and the third semiconductor layer except for two sides so that end portions of the conductive material remain to form the source and the drain, so that end portions of the third semiconductor layer remain, and so as to expose the second semiconductor layer. The substrate and the buffer layer are removed so as to expose a surface of the first semiconductor layer. A gate electrode is formed on the exposed surface of the first semiconductor layer.

Formation of the gate electrode may include forming a first gate electrode on a portion of the exposed surface of the first semiconductor layer, forming an insulating layer for covering the gate electrode, and forming a second gate electrode on the insulating layer and the exposed surface of the first semiconductor layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to field effect semiconductor devices including a gallium nitride (GaN)-based semiconductor having a gate electrode formed on a surface opposite to a surface for forming a source and a drain, and methods of manufacturing the same.

Figure 1:
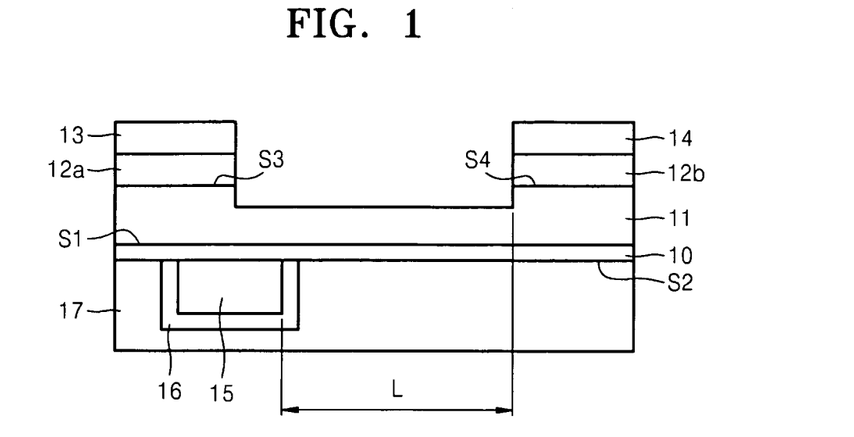
FIG. 1 is a cross-sectional view of a field effect semiconductor device according to example embodiments.

FIG. 1 is a cross-sectional view of a field effect semiconductor device according to example embodiments.

Referring to FIG. 1, a second semiconductor layer 11 is formed on a first surface $s_1$ of a first semiconductor layer 10. Third semiconductor layers 12a and 12b are respectively formed on two sides $s_3$ and $s_4$ of the second semiconductor layer 11.

The third semiconductor layers 12a and 12b may be opposing ends of the second semiconductor layer 11. The third semiconductor layers 12a and 12b may each be on an upper surface of the respective opposing end of the second semiconductor layer 11.

A source 13 and a drain 14 are respectively formed on the third semiconductor layers 12a and 12b. First and second gate electrodes 15 and 17 are formed on a second surface $s_2$ of the first semiconductor layer 10. The first surface Si and the second surface $s_2$ of the first semiconductor layer 10 may be on opposite sides of the first semiconductor layer 10.

The field effect semiconductor device according to example embodiments may have a double gate electrode structure. In detail, the first gate electrode 15 may be formed on a portion of the second surface $s_2$ of the first semiconductor layer 10 that is opposite to the first surface $s_1$ on which the source 13 and the drain 14 are formed. The first gate electrode 15 may be formed on a portion of the second surface $s_2$ of the first semiconductor layer 10 that is opposite to the first surface $s_1$ on which the second semiconductor layer 11 is formed. The first gate electrode 15 is covered by an insulating layer 16. The second gate electrode 17 may be formed on the insulating layer 16 and the second surface $s_2$ of the first semiconductor layer 10.

The first semiconductor layer 10, the second semiconductor layer 11 and the third semiconductor layers 12a and 12b may be formed of gallium nitride (GaN)-based semiconductor materials. The first semiconductor layer 10 and the third semiconductor layers 12a and 12b may be formed of a gallium nitride (GaN)-based semiconductor material having a greater band gap energy than the second semiconductor layer 11. For example, the first semiconductor layer 10 and the third semiconductor layers 12a and 12b may be formed of $Al_xGa_{1-x}N$ (wherein 0<x<1), and the second semiconductor layer 11 may be formed of GaN. Alternatively, the first semiconductor layer 10, the second semiconductor layer 11 and the third semiconductor layers 12a and 12b may be formed of different Groups III through IV semiconductor compounds.

The source 13, the drain 14, the first gate electrode 15 and the second gate electrode 17 may be formed of conductive materials (e.g., a metal, a conductive metal oxide or conductive plastic). The insulating layer 16 may be formed of any material used as an insulating material in a general semiconductor device (e.g., a silicon (Si) oxide or an Si nitride).

Figure 2:
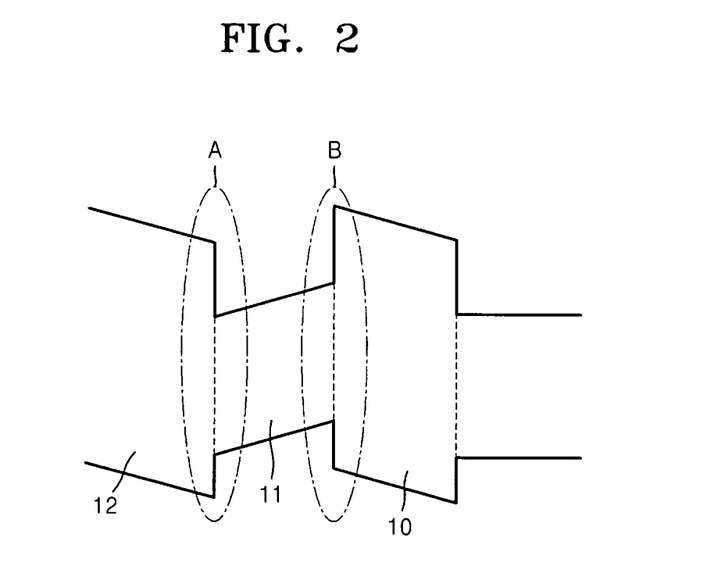
FIG. 2 is a schematic diagram of band gap energies of a first semiconductor layer, a second semiconductor layer and a third semiconductor layer of the field effect semiconductor device of FIG. 1 according to example embodiments.

FIG. 2 is a schematic diagram of band gap energies of the first semiconductor layer, the second semiconductor layer and the third semiconductor layer of the field effect semiconductor device of FIG. 1 according to example embodiments.

In FIG. 2, a junction 'A' between the second semiconductor layer 11 and the third semiconductor layers 12a and 12b is a heterogeneous junction interface formed by creating a two-dimensional electron gas (2D-EG) region due to polarization charges. The third semiconductor layers 12a and 12b may function as a carrier supply layer. The second semiconductor layer 11 has a relatively narrow band gap energy and relatively high electron affinity. The second semiconductor layer 11 may function as a carrier channel layer.

Normally-off characteristics of the field effect semiconductor device according to example embodiments may be obtained by forming the source 13 and the drain 14 on the third semiconductor layers 12a and 12b, respectively, where the 2D-EG region is formed, and by forming the gate electrodes 15 and 17 on a region 'B' in which polarization charges are not generated.

A method of driving the field effect semiconductor device of FIG. 1 will now be described.

In an on-state, a turn-on voltage is applied to the first gate electrode 15 and the second gate electrode 17. However, in an off-stage, a voltage of 0 V is maintained in the first gate electrode 15, and the second gate electrode 17 is floated. Thus, an electric field may be weakened, and a breakdown voltage may be increased by forming the first gate electrode 15 farther from the drain 14 than from the source 13. A horizontal distance between the first gate electrode 15 and the drain 14 may be adjusted from several hundreds of nm to several μm.

Figure 3:
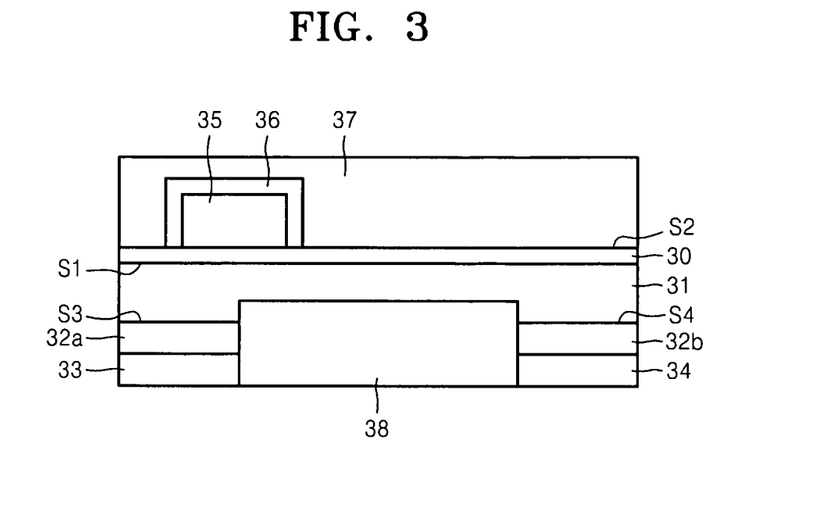
FIG. 3 is a cross-sectional view of a field effect semiconductor device according to example embodiments.

FIG. 3 is a cross-sectional view of a field effect semiconductor device according to example embodiments.

FIG. 1 shows a bottom gate type semiconductor device in which a gate is formed below a semiconductor layer. However, example embodiments are not limited thereto. For example, FIG. 3 shows a top gate type semiconductor device in which a gate is formed above a semiconductor layer.

Referring to FIG. 3, a second semiconductor 31 is formed on a first surface $s_1$ of a first semiconductor layer 30, and third semiconductor layers 32a and 32b are respectively formed under (or on) two sides $s_3$ and $s_4$ of the second semiconductor 31. A source 33 and a drain 34 are respectively formed under (or on) the third semiconductor layers 32a and 32b. A first gate electrode 35 is formed on a portion of a second surface $s_2$ of the first semiconductor layer 30, and the first gate electrode 35 is covered by an insulating layer 36. A second gate electrode 37 is formed on the insulating layer 36 and the second surface $s_2$ of the first semiconductor layer 30. A filling layer 38 may be formed between the source 33 and the drain 34.

The first semiconductor layer 30, the second semiconductor 31 and the third semiconductor layers 32a and 32b may be formed of GaN-based semiconductor materials. The first semiconductor layer 30 and the third semiconductor layers 32a and 32b may be formed of a GaN-based semiconductor material having a greater band gap energy than the second semiconductor 31. In detail, the first semiconductor layer 30 and the third semiconductor layers 32a and 32b may be formed of $Al_xGa_{1-x}N$ (wherein 0<x<1), and the second semiconductor 31 may be formed of GaN. Alternatively, the first semiconductor layer 30, the second semiconductor 31 and the third semiconductor layers 32a and 32b may be formed of different Groups III through V semiconductor compounds.

The source 33, the drain 34, the first gate electrode 35 and the second gate electrode 37 may be formed of a conductive material (e.g., a metal, conductive metal oxide or conductive plastic). The insulating layer 36 and the filling layer 38 may be formed of any material used as an insulating material in a general semiconductor device (e.g., a Si oxide or an Si nitride).

Hereinafter, a method of manufacturing a field effect semiconductor device will now be described. In this case, a method of manufacturing a top gate type transistor will be described.

FIGS. 4A through 4F are cross-sectional views for explaining a method of manufacturing a field effect semiconductor device according to example embodiments.

Figure 4A:
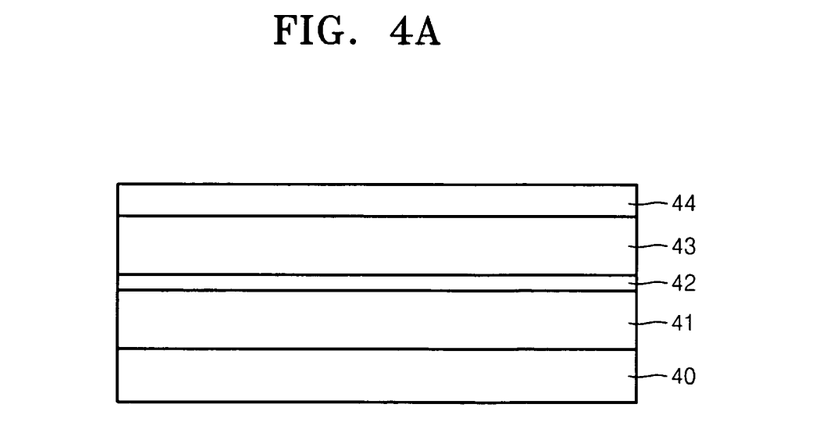
FIGS. 4A through 4F are cross-sectional views for explaining a method of manufacturing a field effect semiconductor device according to example embodiments.

Referring to FIG. 4A, a buffer layer 41 is formed on a substrate 40, and a first semiconductor layer 42, a second semiconductor layer 43 and a third semiconductor layer 44 are formed on the buffer layer 41. The substrate 40 may be formed of any material used to manufacture a semiconductor device (e.g., Si, sapphire ($Al_2O_3$) or silicon carbide (SiC)). The buffer layer 41 may be used to form a semiconductor layer thereon. The buffer layer 41 may be formed of GaN.

The first semiconductor layer 42, the second semiconductor layer 43 and the third semiconductor layer 44 may be formed of GaN-based semiconductor materials. In detail, the first semiconductor layer 42 and the third semiconductor layer 44 may be formed of $Al_xGa_{1-x}N$ (wherein 0<x<1), and the second semiconductor layer 43 may be formed of GaN.

Figure 4B:
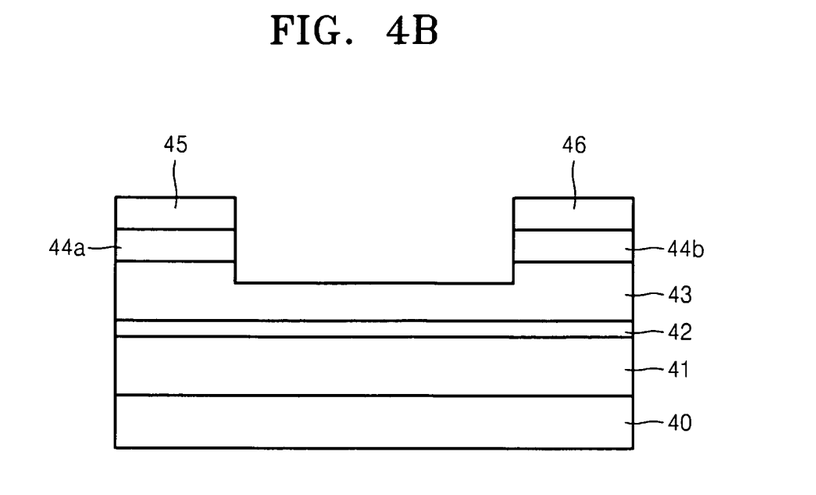

Referring to FIG. 4B, the third semiconductor layer 44 is coated with a conductive material (not shown). The third semiconductor layer 44 and the conductive material are etched except for on two side portions such that end portions of the conductive material remain to form a source 45 and a drain 46, and end portions of the third semiconductor layer 44 remain to form two third semiconductor layers 44a and 44b. The third semiconductor layer 44 and the conductive material are etched so as to expose the second semiconductor layer 43. In this case, the conductive material may be a metal, conductive metal oxide or conductive plastic. The source 45 and the drain 46 are formed respectively on the third semiconductor layers 44a and 44b by etching the conductive material.

The second semiconductor layer 43, or a portion thereof, may also be etched during the etching of the third semiconductor layer 44.

Figure 4C:
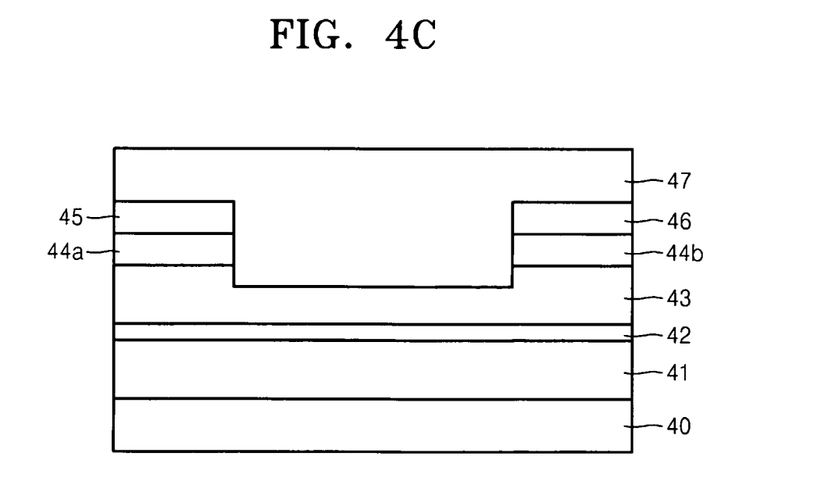

Referring to FIG. 4C, a filling layer 47 is formed on the exposed portions of the second semiconductor layer 43, the third semiconductor layers 44a and 44b, the source 45 and the drain 46. The filling layer 47 may be formed of an insulating material (e.g., Si oxides or Si nitrides).

Figure 4D:
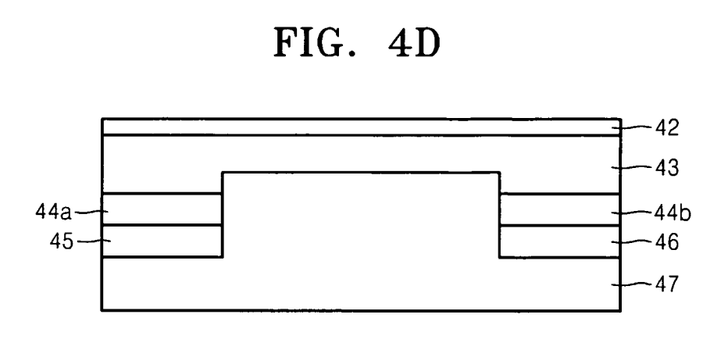

Referring to FIG. 4D, the first semiconductor layer 42 is exposed by removing the substrate 40 and the buffer layer 41.

Figure 4E:
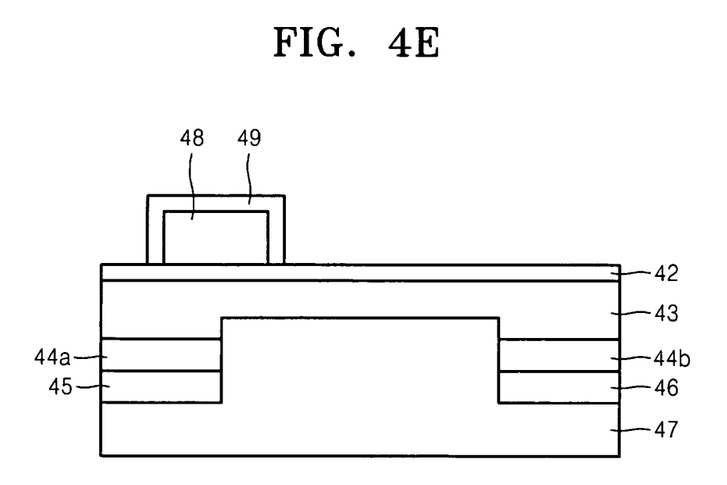

Referring to FIG. 4E, a first gate electrode 48 is formed on a portion of the first semiconductor layer 42 by coating and patterning a conductive material on the exposed surface of the first semiconductor layer 42. The first gate electrode 48 may be formed of a conductive material (e.g., a metal, conductive metal oxide or conductive plastic). The first gate electrode 48 is formed closer to the source 45 than to the drain 46. An insulating layer 49 is formed to cover the first gate electrode 48. The insulating layer 49 may be formed of any material used to manufacture a general semiconductor device.

Figure 4F:
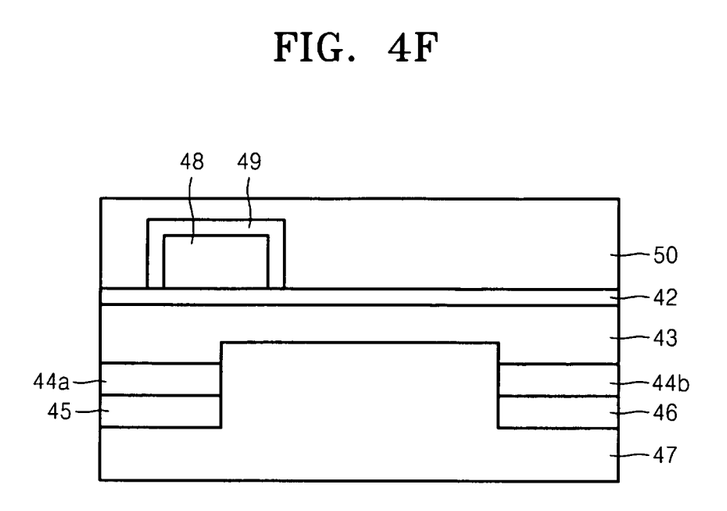

Referring to FIG. 4F, a second gate electrode 50 is formed by coating a conductive material on the first semiconductor layer 42 and the insulating layer 49. The second gate electrode 50 may be formed of a conductive material (e.g., a conductive metal oxide or conductive plastic).

The field effect semiconductor devices according to example embodiments include semiconductor layers having a heterogeneous junction structure formed by creating a 2-dimensional electron gas (2D-EG) region. As described above, according to the above example embodiments, normally-off characteristics of the field effect semiconductor devices may be obtained by forming a gate electrode on an opposite surface to a surface for forming a source and a drain with respect to the 2D-EG region. In addition, the field effect semiconductor device may have a substantially high breakdown voltage by using a double gate electrode structure. Thus, the field effect semiconductor devices have high electrical characteristics.

The field effect semiconductor devices according to example embodiments may be used in communication devices for use in high frequency bands.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. A field effect semiconductor device, comprising:
a second semiconductor layer on a first surface of a first semiconductor layer;
a first and a second third semiconductor layer respectively on the second semiconductor layer;
a source and a drain directly on the first and second third semiconductor layer; and
a gate electrode on a second surface of the first semiconductor layer, wherein the gate electrode is on an opposing side of the first semiconductor layer away from the source and the drain,
wherein the gate electrode has a double gate structure, and
wherein the double gate structure of the gate electrode includes
a first gate electrode directly on a portion of the second surface of the first semiconductor layer,
an insulating layer directly covering the first gate electrode, and
a second gate electrode directly on the insulating layer and the second surface of the first semiconductor layer,
wherein the second gate electrode is positioned on an opposite side of the insulating layer with respect to the first gate electrode, and
the insulating layer is in contact with a bottom surface of the first gate electrode opposite to the second surface of the first semiconductor layer, and in contact with a top surface of the second gate electrode.

2. The field effect semiconductor device of claim 1, wherein a distance between the first gate electrode and the drain is greater than a distance between the first gate electrode and the source.

3. The field effect semiconductor device of claim 1, wherein the first semiconductor layer and the first and second third semiconductor layers are formed of a material having a greater band gap energy than a material used to form the second semiconductor layer.

4. The field effect semiconductor device of claim 1, wherein the first semiconductor layer, the second semiconductor layer and the first and second third semiconductor layers are formed of a gallium nitride (GaN)-based semiconductor material.

5. The field effect semiconductor device of claim 4, wherein the first semiconductor layer and the first and second third semiconductor layers are formed of $Al_xGa_{1-x}N$ (wherein $0<x<1$).

6. The field effect semiconductor device of claim 4, wherein the second semiconductor layer is formed of GaN.

7. The field effect semiconductor device of claim 1, wherein the first semiconductor layer, the second semiconductor layer and the first and second third semiconductor layers are formed of Group III-V semiconductor compounds.

8. The field effect semiconductor device of claim 1, wherein the first and second third semiconductor layers each contacts the second semiconductor layer.

9. The field effect semiconductor device of claim 1, wherein the first and second third semiconductor layers are spaced apart from each other.

10. The field effect semiconductor device of claim 1, wherein the first third semiconductor layer is on a different surface of the second semiconductor layer than the second third semiconductor layer.

11. A method of manufacturing a field effect semiconductor device, the method comprising:
forming a buffer layer, a first semiconductor layer, a second semiconductor layer and a first and second third semiconductor layer on a substrate, wherein the second semiconductor layer is on a first surface of the first semiconductor layer, and the first and a second third semiconductor layer are respectively on the second semiconductor layer;

forming a source and a drain directly on the first and second third semiconductor layer by coating a conductive material on a third semiconductor layer and etching the conductive material and the third semiconductor layer so that end portions of the conductive material remain to form the source and the drain, so that end portions of the third semiconductor layer remain, and so as to expose a portion of the second semiconductor layer;

removing the substrate and the buffer layer so as to expose a second surface of the first semiconductor layer; and forming a gate electrode on the second surface of the first semiconductor layer, wherein the gate electrode is on an opposing side of the first semiconductor layer away from the source and the drain and has a double gate structure, wherein forming the gate electrode having the double gate structure includes forming a first gate electrode directly on a portion of the second surface of the first semiconductor layer;

forming an insulating layer directly covering the first gate electrode; and forming a second gate electrode directly on the insulating layer and the second surface of the first semiconductor layer, wherein the second gate electrode is positioned on an opposite side of the insulating layer with respect to the first gate electrode, and the insulating layer is in contact with a bottom surface of the first gate electrode opposite to the second surface of the first semiconductor layer, and in contact with a top surface of the second gate electrode.

12. The method of claim 11, wherein the first gate electrode is formed at a greater distance from the drain than a distance between the first gate electrode and the source.

13. The method of claim 11, wherein the first semiconductor layer and the third semiconductor layer are formed of a material having a greater band gap energy than a material used to form the second semiconductor layer.

14. The method of claim 11, wherein the first semiconductor layer, the second semiconductor layer and the third semiconductor layer are formed of a GaN-based semiconductor material.

* * * * *